(12) United States Patent
Li et al.

(10) Patent No.: US 12,520,708 B2
(45) Date of Patent: Jan. 6, 2026

(54) DISPLAY PANEL AND DISPLAY DEVICE

(71) Applicant: HKC CORPORATION LIMITED, Shenzhen (CN)

(72) Inventors: Yao Li, Shenzhen (CN); Lidan Ye, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 300 days.

(21) Appl. No.: 18/518,596

(22) Filed: Nov. 23, 2023

(65) Prior Publication Data
US 2025/0008827 A1    Jan. 2, 2025

(30) Foreign Application Priority Data

Jun. 30, 2023  (CN) .......................... 202310795288.5

(51) Int. Cl.
| | | |
|---|---|---|
| *H10K 59/00* | (2023.01) | |
| *G02F 1/169* | (2019.01) | |
| *H10K 59/122* | (2023.01) | |
| *H10K 59/50* | (2023.01) | |
| *H10K 59/80* | (2023.01) | |

(52) U.S. Cl.
CPC ......... *H10K 59/8792* (2023.02); *G02F 1/169* (2019.01); *H10K 59/122* (2023.02); *H10K 59/50* (2023.02)

(58) Field of Classification Search
CPC ...... G02F 1/167; G02F 1/1671; G02F 1/1675; G02F 1/16753; G02F 1/16755; G02F 1/16756; G02F 1/16757; G02F 1/1676; G02F 1/1677; G02F 1/1679; G02F 1/1681; G02F 1/1685; G02F 2001/1678; G02F 1/169; G02F 2201/44; H10K 59/8792; H10K 59/122; H10K 59/50; H10K 59/873
USPC ....................................................... 359/296
See application file for complete search history.

(56) References Cited

U.S. PATENT DOCUMENTS

2016/0238917 A1*   8/2016   Zhang ................... G02F 1/1677

* cited by examiner

*Primary Examiner* — Henry Duong

(57) ABSTRACT

A display panel and a display device are disclosed. The display panel includes a substrate, a light-emitting element, a pixel defining layer corresponding to a non-opening area, an encapsulation layer used to cover the light-emitting element and the pixel defining layer, and an electrically controlled capsule layer including an electrically controlled capsule arranged in an opening area. There are multiple positively or negatively charged black particles inside each electrically controlled capsule. When the light-emitting element emits light or doesn't emit light, the electrically controlled capsule at the corresponding position is in a first state or a second state, respectively. The first state is a light-transmitting state, in which black particles are located on both sides of a light exit surface of the electrically controlled capsule. The second state is a non-light-transmitting state, in which the black particles are located on a light exit surface of the electrically controlled capsule.

18 Claims, 3 Drawing Sheets

DISPLAY PANEL AND DISPLAY DEVICE

CROSS-REFERENCE TO RELATED APPLICATIONS

This application claims the priority and benefit of Chinese patent application number 202310795288.5, titled "Display Panel and Display Device" and filed Jun. 30, 2023 with China National Intellectual Property Administration, the entire contents of which are incorporated herein by reference.

TECHNICAL FIELD

This application relates to the field of display technology, and more particularly relates to a display panel and a display device.

BACKGROUND

The description provided in this section is intended for the mere purpose of providing background information related to this application but doesn't necessarily constitute prior art.

With the continuous development of OLED (Organic Light-Emitting Diode) display technology, OLED is increasingly used in displays such as smartphones, tablets, computers, and TVs. OLED displays have the advantages of thin and light, high contrast, fast response, wide viewing angle, high brightness, full color, etc. In order to reduce the reflectivity of external light inside an OLED display, the current mainstream solution is to attach a circular polarizer to the light exit surface of the OLED display. However, this solution reduces the light-emitting effect due to the great light loss of the circular polarizer. Another solution is to dispose a color filter on the light exit surface of the OLED display to improve the light-emitting efficiency through the color filter. Furthermore, the effect of ambient light reflection in the OLED display can be reduced through the arrangement of a black matrix (BM).

However, when the OLED display panel appears black when the screen is turned off, ambient light, especially relatively strong ambient light, enters the display panel, reaches the anode of the light-emitting element, and is reflected by the anode to form outgoing light, causing the display panel to present problems such as color mixing and glare when in the black state.

SUMMARY

It is therefore a purpose of this application to provide a display panel and a display device to alleviate phenomena such as color mixing and glare caused by ambient light reflection when the display panel is in a black state.

This application discloses a display panel, which includes an opening area and a non-opening area. The display panel includes a substrate, a light-emitting element, a pixel defining layer, an encapsulation layer, and an electrically controlled capsule layer. A plurality of the light-emitting elements are respectively arranged corresponding to a plurality of the opening areas. The light-emitting element includes a bottom electrode, a light-emitting layer, and a top electrode that are stacked in sequence in a direction of getting farther away from the substrate. The pixel defining layer is arranged corresponding to the non-opening area. The encapsulation layer is used to cover the light-emitting element and pixel defining layer. The electrically controlled capsule layer is disposed on a side of the encapsulation layer facing away from the substrate and includes a plurality of electrically controlled capsules. Each of the electrically controlled capsules is arranged corresponding to the respective opening area. A plurality of black particles are disposed in the electrically controlled capsule, and the black particles are positively or negatively charged. When the light-emitting element emits light, the electrically controlled capsule at the corresponding position is in a first state. When the light-emitting element does not emit light, the electrically controlled capsule at the corresponding position is in a second state. The first state of the electrically controlled capsule is a light-transmitting state, in which the black particles are located on both sides of a light exit surface of the electrically controlled capsule. The second state of the electrically controlled capsule is a non-light-transmitting state, in which the black particles are located on the light-incident surface or the light exit surface of the electrically controlled capsule.

In some embodiments, the electrically controlled capsule includes at least a first electrode and a second electrode. The electrically controlled capsule includes a light exit surface and four side surfaces connected to the light exit surface. The first electrode is arranged on the light exit surface. The second electrode is disposed on at least one of the side surfaces. When the light-emitting element emits light, the second electrode of the electrically controlled capsule attracts the black particles, and the black particles are located on the sides of the electrically controlled capsule, so that the electrically controlled capsule is in the first state. When the light-emitting element does not emit light, the first electrode of the electrically controlled capsule attracts the black particles, and the black particles are located on the light exit surface of the electrically controlled capsule, so that the electrically controlled capsule is in the second state.

In some embodiments, the electrically controlled capsule further includes a plurality of colored particles. The plurality of colored particles in each electrically controlled capsule have the same color. The electrically controlled capsule layer further includes a black matrix, and adjacent electrically controlled capsules are separated by the black matrix. The electrically controlled capsule and the black matrix are disposed in the same layer.

In some embodiments, within the same electrically controlled capsule, the number of black particles is less than the number of colored particles.

In some embodiments, in the same electrically controlled capsule, the colored particles and the black particles have different charge polarities.

In some embodiments, the electrically controlled capsule includes a third electrode, a fourth electrode, and at least two fifth electrodes. The electrically controlled capsule includes a light exit surface, four side surfaces connected to the light exit surface, and a light-incident surface opposite to the light exit surface. The third electrode is arranged on the light exit surface. The fourth electrode is disposed on the light incident surface. One of the fifth electrodes is disposed on the respective one of the side surfaces. When the light-emitting element emits light, the fifth electrode of the electrically controlled capsule attracts the black particles, and so the black particles are located on the side of the electrically controlled capsule, while the third electrode and the fourth electrode attract the colored particles, and so the colored particles are located on the light incident surface and the light exit surface of the electrically controlled capsule, and accordingly the electrically controlled capsule is in the first state. When the light-emitting element does not emit light, the fifth electrode of the electrically controlled capsule attracts the colored particles, and so the colored particles are located on the side of the electrically controlled capsule, while the third electrode and the fourth electrode attract the black particles, and so the black particles are located on the light exit surface and the light incident surface of the electrically controlled capsule, and accordingly the electrically controlled capsule is in the second state.

In some embodiments, the third electrode and the fourth electrode have the same polarity but different voltages; the two fifth electrodes have the same polarity but different voltages.

In some embodiments, the black matrix further includes a light shielding piece adjacent to the electrically controlled capsule. The electrically controlled capsule includes a display portion and a non-display portion. The non-display portion is arranged around the display portion. A projection of the non-display portion on the substrate overlaps a projection of the light shielding piece on the substrate. In the first state, the black particles are located in the non-display portion. In the second state, the black particles are located in the display portion.

In some embodiments, the side of the electrically controlled capsule facing away from the substrate is lower than the side of the black matrix facing away from the substrate.

This application discloses a display device, which includes a driver circuit and the above-mentioned display panel, where the driver circuit is used to drive the display panel to display.

In this application, the electrically controlled capsule is used to solve problems such as color mixing and glare that are caused when the display panel does not emit light in part or all of the display area, the external ambient light enters the panel and is reflected by the metal traces or other film layers inside the display panel. The electrically controlled capsule may have two states. In the first state, since the black particles are located on the sides of the electrically controlled capsule, they basically do not affect the light emission from the light exit surface of the electrically controlled capsule. Therefore, in the first state, the electrically controlled capsule is in a light-transmitting state, and the light has a high transmittance. In the second state, since the black particles are located on the light exit surface of the electrically controlled capsule, the light exit surface is in a black state and has relatively strong light absorption characteristics. When external ambient light irradiates the non-light-emitting display area, black particles are operative to absorb and block the external ambient light, and make the non-light-emitting display area appear black, thus avoiding color separation, glare and other phenomena caused by ambient light reflection. The display effect of the display panel is thus improved, and the quality of the display panel is also improved.

BRIEF DESCRIPTION OF DRAWINGS

The accompanying drawings are used to provide a further understanding of the embodiments according to this application, and constitute a part of the specification. They are used to illustrate the embodiments according to this application, and explain the principle of this application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
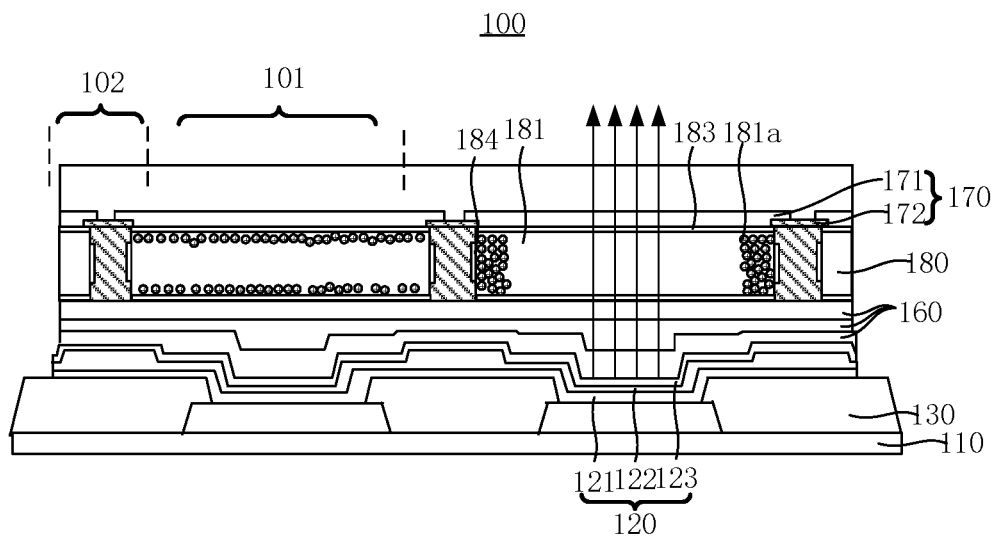
FIG. 1 discloses a schematic diagram of a first display panel according to a first embodiment of the present application.

In the drawings: 100, display panel; 101, opening area; 102, non-opening area; 110, substrate; 120, light-emitting element; 121, bottom electrode; 122, light-emitting layer; 123, top electrode; 130, pixel defining layer; 160, encapsulation layer; 170, color filter layer; 171, color filter layer; 171, color filter; 172, black matrix; 173, light shielding piece; 180, electrically controlled capsule layer; 180a, light incident surface; 180b, light exit surface; 180c, side surface; 181, electrically controlled capsule; 181a, black particle; 181b, colored particle; 183, first electrode; 184, second electrode; 185, third electrode; 186, fourth electrode; 187, fifth electrode; 188, display portion; 189, non-display portion; 200, display device; 210, driver circuit.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. In addition, terms "up", "down", "left", "right", "vertical", and "horizontal", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. For those of ordinary skill in the art, the specific meanings of the above terms as used in this application can be understood depending on specific contexts.

Hereinafter this application will be described in further detail with reference to the accompanying drawings and some optional embodiments.

Embodiment 1

FIG. 1 discloses a schematic diagram of a first display panel ac-cording to a first embodiment of this application.

Referring to FIG. 1, this application discloses a display panel 100. The display panel 100 includes an opening area 101 and a non-opening area 102. The opening area 101 may refer to the position of the color filter 171, namely the area that can display RGB colors during display, and roughly corresponds to the area between adjacent pixel defining layers 130 of the display panel 100. The non-opening area 102 refers to the position of the black matrix 172, which is displayed as black during display and roughly corresponds to the area of the pixel defining layer 130. Both the opening area 101 and the non-opening area 102 may be located in the display area of the display panel 100.

The display panel 100 includes a substrate 110, a light-emitting element 120, a pixel defining layer 130, an encapsulation layer 160, and an electrically controlled capsule layer 180. A plurality of the light-emitting elements 120 are respectively disposed corresponding to a plurality of the opening areas 101. Along the direction of getting away from the substrate 110, each light-emitting element 120 includes a bottom electrode 121, a light-emitting layer 122, and a top electrode 123 that are stacked in sequence. The pixel defining layer 130 is disposed corresponding to the non-opening area 102. The encapsulation layer 160 is used to cover the light-emitting element 120 and the pixel defining layer 130. The electrically controlled capsule layer 180 is disposed on a side of the encapsulation layer 160 facing away from the substrate 110 and includes a plurality of electrically controlled capsules 181. Each of the electrically controlled capsules 181 is arranged corresponding to the respective opening area 101. A plurality of black particles 181a are arranged in the electrically controlled capsule 181, and the black particles 181a are positively or negatively charged. When the light-emitting element 120 emits light, the electrically controlled capsule 181 at the corresponding position is in a first state. When the light-emitting element 120 does not emit light, the electrically controlled capsule 181 at the corresponding position is in a second state. The first state of the electrically controlled capsule 181 is a light-transmitting state, in which the black particles 181a are located on both sides of the light exit surface 180b of the electrically controlled capsule 181. The second state of the electrically controlled capsule 181 is a non-light-transmitting state, in which the black particles 181a are located on the light incident surface 180a or the light exit surface 180b of the electrically controlled capsule 181.

This application uses the electrically controlled capsule 181 to solve problems such as color mixing and glare caused by external ambient light entering the surface and being reflected by the metal traces or other film layers inside the display panel 100 when the display panel 100 does not emit light in part or all of the display area. The electrically controlled capsule 181 may have two states. In the first state, since the black particles 181a are located on the sides 180c of the electrically controlled capsule 181, they basically do not affect the light emission from the light exit surface 180b of the electrically controlled capsule 181. Therefore, in the first state, the electrically controlled capsule 181 is in a light-transmitting state, and the light has a high transmittance. In the second state, since the black particles 181a are located on the light exit surface 180b of the electrically controlled capsule 181, the light exit surface 180b is in a black state and has relatively strong light absorption characteristics. When external ambient light irradiates the non-light-emitting display area, black particles 181a are operative to absorb and block the external ambient light, and make the non-light-emitting display area appear black, thus avoiding color separation, glare and other phenomena caused by ambient light reflection. The display effect of the display panel 100 is thus improved, and the quality of the display panel 100 is also improved.

The electrically controlled capsule 181 of this application is an electronic ink structure. Different from the electronic inks that may have a black state and a white state, only black particles 181a are disposed in the electrically controlled capsule 181 in this embodiment. By respectively controlling the light exit surface 180b and the side surfaces 180c of the electrically controlled capsule 181 through electrodes, the black particles 181a may be made adjacent to the light exit surface 180b or the side surfaces 180c, thereby realizing switching from the first state to the second state. In the first state, most of the black particles 181a are located on the sides 180c of the electrically controlled capsule 181. At this time, there are basically no black particles 181a on the light exit surface 180b of the electrically controlled capsule 181, thereby showing a light-transmitting state. At this time, the light-emitting element 120 of the display panel 100 emits light, and the light is emitted from the light exit surface 180b of the electrically controlled capsule 181, where there is basically no impact on the emitted light. In the second state, the black particles 181a are controlled by the electrodes so that most of the black particles 181a are located on the light exit surface 180b of the electrically controlled capsule 181. As such, the electrically controlled capsule 181 is in a black state and appears as a black color. At this time, when the external ambient light passes through some of the film layers and enters the electrically controlled capsule 181, it is absorbed by the black particles 181a. Even if it is partially reflected back, the electrically controlled capsule 181 will appear black. This avoids problems such as glare or color separation caused by external ambient light reflecting RGB colors after passing through the color filter layer 170.

In particular, the light-emitting element 120 includes a top electrode 123, a light-emitting layer 122, and a bottom electrode 121. The bottom electrode 121 is disposed on the substrate 110. The light-emitting layer 122 is disposed on the bottom electrode 121. The top electrode 123 is disposed on the light-emitting layer 122. The bottom electrode 121 may be a metal electrode used as the anode of the light-emitting element 120. The top electrode 123 may use a transparent conductive layer as the cathode of the light-emitting element 120. Driven by a certain voltage, electrons and holes respectively move from the cathode and anode to the light-emitting layer 122 and recombine to emit visible light. The light-emitting element 120 in this embodiment may be a red light-emitting element 120, a green light-emitting element 120, a blue light-emitting element 120, or a white light-emitting element 120.

A color filter layer 170 is further disposed on the electrically controlled capsule 181. The color filter layer 170 mainly includes a red filter, a green filter, and a blue filter, which are disposed corresponding to the red light-emitting element 120, the green light-emitting element 120, and the blue light-emitting element 120, or corresponding to the white light-emitting element 120. When external ambient light enters, because the ambient light may include the entire visible light band or a wide spectrum band, the color filter 171 may filter out most of the wavelength bands of the ambient light. After natural light (white light) passes through the color filter 171, only the light of the corresponding color is transmitted, and the light in other wavelength bands will be absorbed by the color filter 171. For example, the red filter may only allow transmission of red light. After the red light enters the light-emitting element 120, since the bottom electrode 121 in the light-emitting element 120 is a metal electrode and has a high reflectivity, the red light is reflected and emitted from the red filter or from other pixel positions, causing glare.

Furthermore, due to the presence of the color filters, when the display panel 100 is not displayed in a black state, the ambient light may pass through the color filter layer 170 and then reach the anode of the light-emitting element 120. After being reflected by the anode, it may pass through the organic light-emitting layer 122 and the color filter layer 170 and then exit. At this time, after the human eye receives the light with three colors of RGB, it may see colors on the screen. When the ambient light, such as sunlight, is of high intensity, the user may also see an obvious color halo, causing the black state to not be so black. In this embodiment, by arranging black particles 181a, when the display panel 100 is not displaying, the black particles 181a absorb the ambient light and appear black, thereby avoiding the above-mentioned problems such as glare and color halo.

Figure 2:
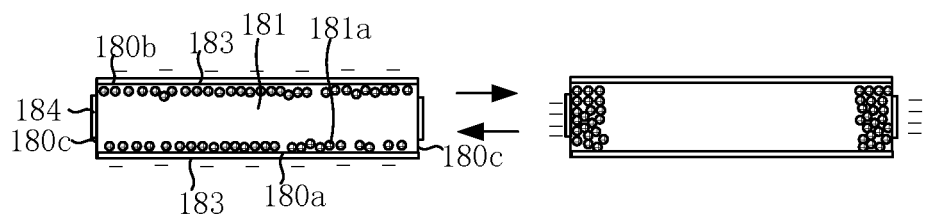
FIG. 2 is a schematic diagram of an electrically controlled capsule according to the first embodiment of the present application.

FIG. 2 is a schematic diagram of an electrically controlled capsule according to a first embodiment of this application. As shown in FIG. 2, the electrically controlled capsule 181 includes a light exit surface 180b, four side surfaces 180c connected to the light exit surface 180b, and a light-incident surface 180a opposite to the light exit surface 180b.

The electrically controlled capsule 181 includes at least a first electrode 183 and a second electrode 184. The first electrode 183 is disposed on the light exit surface 180b. The second electrode 184 is disposed on at least one of the side surfaces 180c. When the light-emitting element 120 emits light, the second electrode 184 of the electrically controlled capsule 181 attracts the black particles 181a so that the black particles 181a are located on the sides 180c of the electrically controlled capsule 181, and the electrically controlled capsule 181 enters the first state. When the light-emitting element 120 does not emit light, the first electrode 183 of the electrically controlled capsule 181 attracts the black particles 181a so that the black particles 181a are located on the light exit surface 180b of the electrically controlled capsule 181, and the electrically controlled capsule 181 enters the second state.

When the black particles 181a are negatively charged, the first electrode 183 or the second electrode 184 may be applied with a positive voltage. When the black particles 181a are positively charged, the first electrode 183 or the second electrode 184 may be applied with a negative voltage. When a corresponding sub-pixel of the display panel 100 emits light for display, the respective second electrode 184 is driven to provide a positive or negative voltage. At this time, the first electrode 183 does not provide a voltage, and the second electrode 184 attracts the negatively charged or positively charged black particles 181a, so that most of the black particles 181a are located on both sides of the electrically controlled capsule 181. At this time, the electrically controlled capsule 181 is in the first state. When the display panel 100 is in non-light-emitting display state, the first electrode 183 is driven to provide a positive voltage or a negative voltage. At this time, the second electrode 184 does not provide a voltage, and so the first electrode 183 attracts the negatively charged or positively charged black particles 181a, so that most of the black particles 181a are located on the light exit surface 180b of the electrically controlled capsule 181.

In particular, the area of the first electrode 183 may be approximately equal to the area of the light exit surface 180b of the electrically controlled capsule 181, and the area of the second electrode 184 may be smaller than the area of the side surface 180c of the electrically controlled capsule 181.

Furthermore, the first electrode 183 and the second electrode 184 are not connected to each other, and there is insulation therebetween. This makes it possible to prevent the black particles 181a from being accumulated at the corners of the first electrode 183 and the second electrode 184.

In particular, two first electrodes 183 are disposed, respectively on the light exit surface 180b and the light-incident surface 180a. At least two second electrodes 184 are provided and respectively disposed on two opposite sides 180c.

In this embodiment, by applying an electric field to the upper and lower first electrodes 183 or the two left and right second electrodes 184, the black particles 181a may be switched from the light exit surface 180b to the side surfaces 180c. That is, electrode blocks are respectively disposed on the light exit surface 180b and the light incident surface 180a to realize black particles 181a on two sides. Two electrode blocks are respectively disposed on the sides 180c so that the black particles 181a are evenly dispersed to the sides 180c to avoid affecting light transmission.

The plurality of electrically controlled capsules 181 of this application have a first driving mode, which can be used in two states, including a black state when the display panel 100 is completely closed and a use state. When the display panel 100 is not operating, that is, when the display panel 100 is completely closed and the screen is in the black state, all the electrically controlled capsules 181 are controlled to be in the second state, so that all the black particles 181a are near to the light exit surface 180b. When external ambient light is incident, it can be completely absorbed by the black light-absorbing layer to overcome the black state halo phenomenon of the OLED display panel 100 using the color filter layer 170. When the display panel 100 is operating normally, that is, when the display panel 100 is displaying normally, all the electrically controlled capsules 181 are controlled to be in the first state, so that the electrically controlled capsules 181 have no impact on the display. In this driving method, there is no need for a complicated driving mode. All the first electrodes 183 and all the second electrodes 184 may be separately connected together and controlled by a controller, which is convenient, simple, low cost, and has low power consumption. However, it is impossible to realize independent control of the electrically controlled capsule 181 corresponding to each sub-pixel.

In a second driving mode, partitioned control or individual and independent control of each electrically controlled capsule 181 may be used. They are applied when the display panel 100 is partially emitting light or is partially not emitting light. That is, the first electrode 183 and the second electrode 184 of each electrically controlled capsule 181 in this embodiment may be driven separately and independently to achieve independent switching from the first state to the second state of the electrically controlled capsule part 181 in each of different sub-pixel areas. For example, when the light-emitting element 120 in a current sub-pixel area emits light, but there is a light-emitting element 120 in the adjacent sub-pixel area that does not emit light, the electrically controlled capsule 181 corresponding to the light-emitting element 120 that does not emit light may be in the second state, and the electrically controlled capsule 181 corresponding to the light-emitting element 120 that emits light may be in the first state. Thus, the non-light-emitting area may be even made darker, while the light emission is not affected in the light-emitting area, so that the contrast of the display panel 100 may be greatly improved.

It is worth mentioning that when the screen of the display panel 100 is lit, especially in a monochrome picture, adjacent pixels of other colors may be lit, causing the monochrome to be impure and the color coordinates to deviate from the original target values, so that the image may have a certain degree of color distortion. This phenomenon is called lateral crosstalk. In particular, different light-emitting elements 120 may have different light-emitting layers 122, where the light-emitting layers 122 include a red light-emitting layer 122, a green light-emitting layer 122, and a blue light-emitting layer 122. The hole injection layers (HIL) below the three light-emitting layers 122 may be connected in series using a common layer (HIL-Common). During use, since the common layer penetrates the entire surface, it may cause lateral current leakage, causing adjacent sub-pixels to be lit, especially in the images corresponding to blue sub-pixels. This is mainly due to the relatively lower light-emitting efficiency of the blue sub-pixel, which results in a higher lit-up voltage than that of the red and green sub-pixels. As such, when the blue sub-pixel emits light, its own voltage would be higher than the lit-up voltage of the red sub-pixel and the green sub-pixel. As a result, the red sub-pixel and the green sub-pixel are easily activated to emit light by the leakage current, causing "light-stealing" situations. In this application, the electrically controlled capsules 181 can be individually controlled. Even if the sub-pixel not meat to display is lit up due to "light stealing", the electrically controlled capsule 181 is displayed as black and so blocks the emission of this part of light to avoid the occurrence of light leakage, thus greatly overcoming the above problem.

Figure 3:
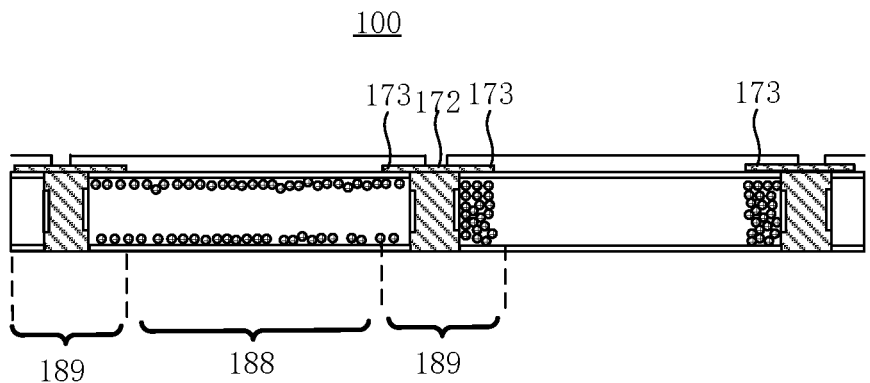
FIG. 3 is a schematic diagram of a second display panel according to the first embodiment of the present application.

FIG. 3 is a schematic diagram of a second display panel according to the first embodiment of this application. As shown in FIG. 3, a projection area of the electrically controlled capsule 181 on the substrate 110 is larger than a projection area of the corresponding color filter 171 on the substrate 110. The electrically controlled capsule 181 includes a display portion 188 and a non-display portion 189. The non-display portion 189 is arranged around the display portion 188. A projection of the non-display portion 189 on the substrate 110 overlaps a projection of the light shielding piece 173 on the substrate 110. The projections of the display portion 188 and the color filter 171 on the substrate 110 completely coincide.

In this embodiment, when the electrically controlled capsule 181 is in the first state, the black particles 181a are located in the non-display portion 189. When the electrically controlled capsule 181 is in the second state, the black particles 181a are located in the display portion 188 and adjacent to the light exit surface 180b or the light incident surface 180a. In this embodiment, the area of the electrically controlled capsule 181 is set to be larger than the area of the color filter 171, so that when the black particles 181a are not needed, the black particles 181a are attracted to the non-display portion 189 through the second electrode 184 for collection. It can be understood that the non-display portion 189 may be blocked by a black matrix 172 on the color filter layer 170. Of course, it may not be needed to be blocked.

It can be understood that in the drawings, the black particles 181a are positively charged and the colored particles 181b are negatively charged as an example for illustration.

Embodiment 2

Figure 4:
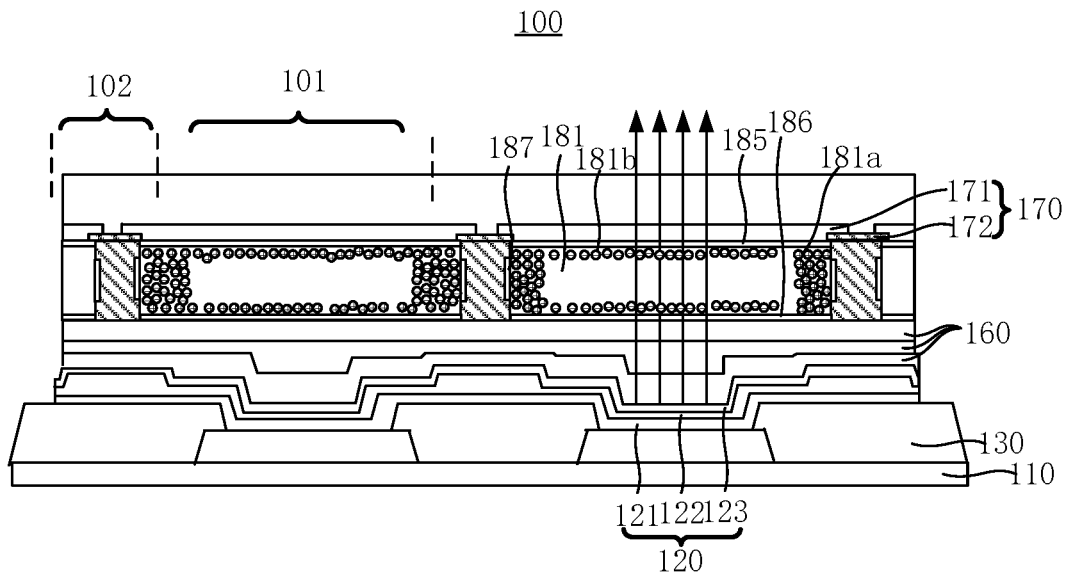
FIG. 4 is a schematic diagram of a display panel according to a second embodiment of the present application.

FIG. 4 is a schematic diagram of a display panel according to a second embodiment of this application. Referring to FIG. 4, this embodiment discloses another display panel 100. The display panel 100 includes a substrate 110, a light-emitting element 120, a pixel defining layer 130, an encapsulation layer 160, and an electrically controlled capsule layer 180. A plurality of the light-emitting elements 120 are respectively disposed corresponding to a plurality of the opening areas 101. Along the direction of getting away from the substrate 110, the light-emitting element 120 includes a bottom electrode 121, a light-emitting layer 122, and a top electrode 123 that are stacked in sequence. The pixel defining layer 130 is disposed corresponding to the non-opening area 102. The encapsulation layer 160 is used to cover the light-emitting element 120 and the pixel defining layer 130. The electrically controlled capsule layer 180 is disposed on a side of the encapsulation layer 160 facing away from the substrate 110 and includes a plurality of electrically controlled capsules 181. Each of the electrically controlled capsules 181 is disposed in the respective opening area 101. A plurality of black particles 181a are disposed in the electrically controlled capsule 181, and the black particles 181a are positively or negatively charged. When the light-emitting element 120 emits light, the electrically controlled capsule 181 at the corresponding position is in a first state. When the light-emitting element 120 does not emit light, the electrically controlled capsule 181 at the corresponding position is in a second state. The first state of the electrically controlled capsule 181 is a light-transmitting state, in which the black particles 181a are located on both sides of the light exit surface 180b of the electrically controlled capsule 181. The second state of the electrically controlled capsule 181 is a non-light-transmitting state, in which the black particles 181a are located on the light exit surface 180b of the electrically controlled capsule 181.

A plurality of colored particles 181b are further disposed in the electrically controlled capsule 181. The plurality of colored particles 181b in each electrically controlled capsule 181 have the same color. The electrically controlled capsule layer 180 further includes a black matrix 172, and adjacent electrically controlled capsules 181 are separated by the black matrix 172. The electrically controlled capsule 181 and the black matrix 172 are disposed in the same layer.

In this embodiment, the color filter 171 is completely replaced by the electrically controlled capsule 181, by arranging colored particles 181b, such as red particles, green particles and blue particles, in the electrically controlled capsule parts 181. Colored particles 181b of only one color are disposed in each same electrically controlled capsule 181. The colored particles 181b have a relatively high light transmittance. Taking red particles as an example, after white light passes through the red particles, other colors are absorbed and red light passes through and the respective electrically controlled capsule 181 appears red. In this embodiment, by omitting the color filter layer 170 and directly replacing it with a plurality of electrically controlled capsules 181, the cost is reduced compared with the previous embodiment.

Figure 5:
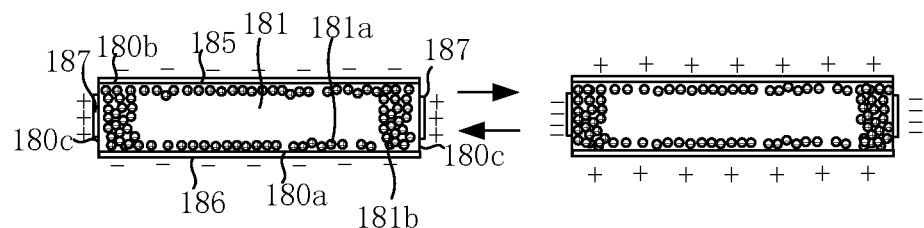
FIG. 5 is a schematic diagram of the electrically controlled capsule according to the first embodiment of the present application.

FIG. 5 is a schematic diagram of an electrically controlled capsule part according to the first embodiment of this application. As shown in FIG. 5, in the same electrically controlled capsule 181, the colored particles 181b and the black particles 181a have different charge polarities. In this embodiment, by setting the charge polarities of the colored particles 181b and the black particles 181a to be different, an electric field can be applied by the electrodes to cause the colored particles 181b and the black particles 181a to move in different directions, so that in the first state, the colored particles 181b are adjacent to the light exit surface 180b or the light incident surface 180a, and the black particles 181a are located on the sides 180c. In the second state, the colored particles 181b are adjacent to the sides 180c, and the black particles 181a are adjacent to the light exit surface 180b or the light incident surface 180a. Thus, switching from the first state to the second state is achieved, and unlike the previous embodiment, although the first state in this embodiment is also a light-transmitting state, this embodiment has different colors for different sub-pixels. For example, the first state of the electrically controlled capsule 181 corresponding to the red sub-pixel is a red light-transmitting state, the first state of the electronically controlled capsule 181 corresponding to the green sub-pixel is a green light-transmitting state, and the first state of the electrically controlled capsule 181 corresponding to the blue sub-pixel is a blue light-transmitting state.

In particular, each electrically controlled capsule 181 includes a third electrode 185, a fourth electrode 186, and at least two fifth electrodes 187. The electrically controlled capsule 181 includes a light exit surface 180b, four side surfaces 180c connected to the light exit surface 180b, and a light incident surface 180a opposite to the light exit surface 180b. The third electrode 185 is disposed on the light exit surface 180b. The fourth electrode 186 is disposed on the light incident surface 180a. One of the fifth electrodes 187 is disposed on one of the side surfaces 180c.

When the light-emitting element 120 emits light, the fifth electrode 187 of the electrically controlled capsule 181 attracts the black particles 181a, and so the black particles 181a are located on the sides 180c of the electrically controlled capsule 181. The third electrode 185 and the fourth electrode 186 attract the colored particles 181b, and so the colored particles 181b are located on the light incident surface 180a and the light exit surface 180b of the electrically controlled capsule 181. Accordingly, the electrically controlled capsule 181 is in the first state.

When the light-emitting element 120 does not emit light, the fifth electrode 187 of the electrically controlled capsule 181 attracts the colored particles 181b, and so the colored particles 181b are located on the sides 180c of the electrically controlled capsule 181. The third electrode 185 and the fourth electrode 186 attract the black particles 181a, and so the black particles 181a are located on the light exit surface 180b and the light incident surface 180a of the electrically controlled capsule 181. Accordingly, the electrically controlled capsule 181 is in the second state.

In this embodiment, by the action of the third electrode 185 and the fourth electrode 186, the colored particles 181b or the black particles 181a are controlled to cover the light-incident surface 180a or the light exit surface 180b. The colored particles 181b or the black particles 181a are controlled by the fifth electrodes 187 on both sides to be located on the sides 180c of the electrically controlled capsule 181. It can be understood that the number of fifth electrodes 187 is not limited herein, and can be up to four.

In particular, the third electrode 185 and the fourth electrode 186 have the same polarity and different voltages. The two fifth electrodes 187 have the same polarity but different voltages.

In particular, negative voltages are applied to the third electrode 185 and the fourth electrode 186 respectively. However, in order to ensure that the electric field force has a left-and-right effect, there needs to be a magnitude difference between the third electrode 185 and the fourth electrode 186, that is, the absolute value of the voltage of the first electrode 183 may be greater or less than the absolute value of the voltage of the second electrode 184. The difference is that the side with the larger absolute value has a comparatively stronger attraction to the black particles 181a, and this side attracts more spheres than the other side. In particular, for the third electrode 185 and the fourth electrode 186, the absolute value of the voltage of the third electrode 185 is greater than the absolute value of the voltage of the fourth electrode 186. Similarly, positive voltages are applied to the left and right fifth electrodes 187 respectively. It is required that the absolute value of the voltage of one of the fifth electrodes 187 is greater or smaller than the absolute value of the voltage of the other fifth electrode 187. In this state, the black particles 181a are located on the upper and lower sides, and the colored particles are located on the left and right sides. On the contrary, negative voltages may be applied to the two fifth electrodes 187 respectively, and positive voltages may be applied to the third electrode 185 and the fourth electrode 186 respectively. In this state, the colored particles are located on the upper and lower sides, and the black particles 181a are located on the left and right sides. It should be noted that in order to prevent the third electrode 185, the fourth electrode 186 and the fifth electrode 187 from having two kinds of electrical balls piled up in disorder at the corners, the length of the third electrode 185 and the fourth electrode 186 needs to cover the lateral cross-sectional size of the electrically controlled capsule 181, and the fifth electrode 187 needs to be appropriately smaller than the height of the electrically controlled capsule 181 to ensure that the particle movement and arrangement of the third electrode 185 dominates at the corners of the third electrode 185 and the fifth electrode 187.

Figure 6:
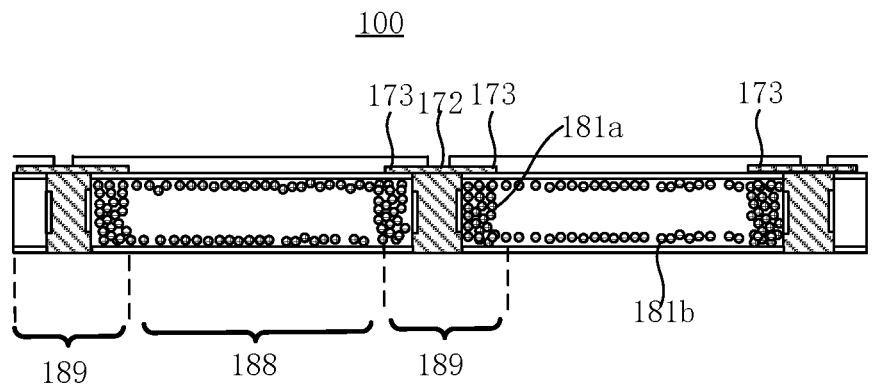
FIG. 6 is a schematic diagram of a second display panel according to the second embodiment of the present application.

FIG. 6 is a schematic diagram of a second display panel according to the second embodiment of this application. As shown in FIG. 6, the black matrix 172 further includes a light shielding piece 173 adjacent to the electrically controlled capsule 181. The electrically controlled capsule 181 includes a display portion 188 and a non-display portion 189. The non-display portion 189 is arranged around the display portion 188. A projection of the non-display portion 189 on the substrate 110 overlaps a projection of the light shielding piece 173 on the substrate 110. In the first state, the black particles 181a are located in the non-display portion 189. In the second state, the black particles 181a are located in the display portion 188.

In this embodiment, when the electrically controlled capsule 181 is in the first state, the black particles 181a are located in the non-display portion 189 and the colored particles 181b are located in the display portion 188. When the electrically controlled capsule 181 is in the second state, the black particles 181a are located in the display portion 188 and adjacent to the light exit surface 180b or the light incident surface 180a, and the colored particles 181b are located in the non-display portion 189. In this embodiment, by setting the area of the electrically controlled capsule 181 to be larger than the area of the color filter 171, when the black particles 181a are not needed, the black particles 181a may be attracted to the non-display portion 189 for collection by means of the second electrode 184. In particular, the side of the electrically controlled capsule 181 facing away from the substrate 110 is lower than the side of the black matrix 172 facing away from the substrate 110. The light shielding piece 173 of the black matrix 172 is used to serve the function of light blockage.

Figure 7:
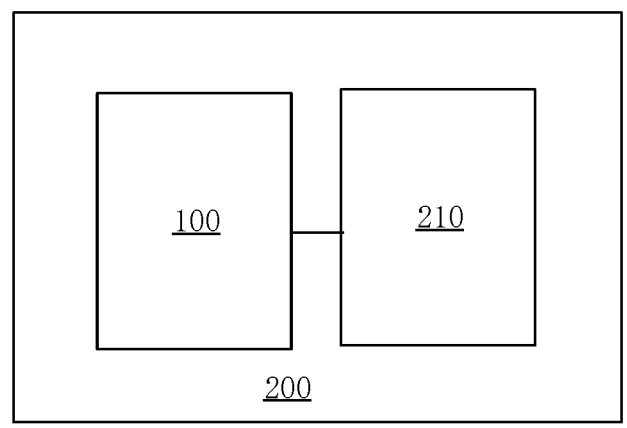
FIG. 7 is a schematic diagram of a display device according to a third embodiment of the present application.

FIG. 7 is a schematic diagram of a display device according to a third embodiment of this application. Referring to FIG. 7, this application discloses a display device. The display device 200 includes a driver circuit 210 and the display panel 100 described in any of the above embodiments, where the driver circuit 210 is used to drive the display panel 100 to display.

In this application, the electrically controlled capsule 181 is used to solve problems such as color mixing and glare that are caused when the display panel 100 does not emit light in part or all of the display area, the external ambient light enters the panel and is reflected by the metal traces or other film layers inside the display panel 100. The electrically controlled capsule 181 may have two states. In the first state, since the black particles 181a are located on the sides 180c of the electrically controlled capsule 181, they basically do not affect the light emission from the light exit surface 180b of the electrically controlled capsule 181. Therefore, in the first state, the electrically controlled capsule 181 is in a light-transmitting state, and the light has a high transmittance. In the second state, since the black particles 181a are located on the light exit surface 180b of the electrically controlled capsule 181, the light exit surface 180b is in a black state and has relatively strong light absorption characteristics. When external ambient light irradiates the non-light-emitting display area, black particles 181a absorb and block the external ambient light, and make the non-light-emitting display area appear black, thus avoiding color separation, glare and other phenomena caused by ambient light reflection. The display effect of the display panel 100 is thus improved, and the quality of the display panel 100 is also improved.

It should be noted that the inventive concept of this application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing is merely a further detailed description of this application with reference to some specific illustrative embodiments, but the specific implementations of this application are not to be construed to be limited to these illustrative embodiments. For those having ordinary skill in the technical field to which this application pertains, numerous deductions or substitutions may be made without departing from the concept of this application, which shall all be regarded as falling in the scope of protection of this application.

What is claimed is:

1. A display panel comprising a plurality of opening areas and a plurality of non-opening areas, the display panel further comprising:
    a substrate;
    a plurality of light-emitting elements, which are respectively arranged corresponding to the plurality of opening areas, wherein each light-emitting element comprises a bottom electrode, a light-emitting layer, and a top electrode that are stacked in sequence in a direction of getting farther away from the substrate;
    a pixel defining layer, arranged corresponding to each non-opening area;
    an encapsulation layer, used to cover the light-emitting elements and the pixel defining layers;
    an electrically controlled capsule layer, arranged on a side of the encapsulation layer facing away from the substrate and comprising a plurality of electrically controlled capsules, wherein each of the plurality of electrically controlled capsules is arranged corresponding to the respective opening area;
    wherein there is disposed a plurality of black particles in each electrically controlled capsule, and wherein the plurality of black particles are positively or negatively charged;
    wherein when each light-emitting element emits light, the respective electrically controlled capsule at a corresponding position is in a first state; when each light-emitting element does not emit light, the respective electrically controlled capsule at a corresponding position is in a second state;
    wherein the first state of each electrically controlled capsule is a light-transmitting state, in which the respective plurality of black particles are located on both sides of a light exit surface of the electrically controlled capsule; and wherein the second state of each electrically controlled capsule is a non-light-transmitting state, in which the respective plurality of black particles are located on a light-incident surface or a light exit surface of the electrically controlled capsule.

2. The display panel recited in claim 1, wherein each electrically controlled capsule comprises at least a first electrode and a second electrode;
    wherein each electrically controlled capsule comprises the light exit surface and four side surfaces connected to the light exit surface; wherein the first electrode is arranged on the light exit surface, and the second electrode is arranged on at least one of the four side surfaces;
    wherein when each light-emitting element emits light, the second electrode of the respective electrically controlled capsule is operative to attract the respective black particles so that the respective black particles are located on at least one of the four side surfaces of the electrically controlled capsule, and so the electrically controlled capsule is in the first state; and
    wherein when each light-emitting element does not emit light, the first electrode of the respective electrically controlled capsule is operative to attract the respective black particles so that the respective black particles are located on the light exit surface of the electrically controlled capsule, and so the electrically controlled capsule is in the second state.

3. The display panel recited in claim 2, wherein an area of each first electrode is equal to an area of the light exit surface of the respective electrically controlled capsule, and wherein an area of each second electrode is less than an area of the corresponding side surface of the respective electrically controlled capsule.

4. The display panel recited in claim 1, wherein there is further disposed a plurality of colored particles in each electrically controlled capsule, and wherein the plurality of colored particles in each electrically controlled capsule have a same color;
    wherein each electrically controlled capsule layer further comprises a black matrix, and wherein every two adjacent electrically controlled capsules are separated by the black matrix; wherein the electrically controlled capsule and the black matrix are disposed in a same layer.

5. The display panel recited in claim 4, wherein a number of the plurality of black particles is less than a number of the plurality of colored particles in each same electrically controlled capsule.

6. The display panel recited in claim 4, wherein in each same electrically controlled capsule, the plurality of colored particles have a different charge polarity than the charge polarity of the plurality of black particles.

7. The display panel recited in claim 6, wherein each electrically controlled capsule comprises a third electrode, a fourth electrode, and at least two fifth electrodes;
   wherein each electrically controlled capsule comprises a light exit surface, four side surfaces connected to the light exit surface, and a light-incident surface opposite to the light exit surface; wherein the third electrode is disposed on the light exit surface, the fourth electrode is arranged on the light-incident surface, and each of the at least two fifth electrodes is disposed on a respective one of the four side surfaces;
   wherein when each light-emitting element emits light, the at least two fifth electrodes of the respective electrically controlled capsule are operative to attract the respective black particles so that the respective black particles are located on the corresponding side surfaces of the respective electrically controlled capsule, and wherein the third electrode and the fourth electrode are operative to attract the respective colored particles so that the respective colored particles are located on the light incident surface and the light exit surface of the respective electrically controlled capsule, and wherein at this time the electrically controlled capsule is in the first state;
   wherein when each light-emitting element does not emit light, the at least two fifth electrodes of the respective electrically controlled capsule are operative to attract the respective colored particles so that the respective colored particles are located on the corresponding side surfaces of the respective electrically controlled capsule, and wherein the third electrode and the fourth electrode are operative to attract the respective black particles so that the respective black particles are located on the light exit surface and the light incident surface of the respective electrically controlled capsule, and wherein at this time the electrically controlled capsule is in the second state.

8. The display panel recited in claim 7, wherein the third electrode and the fourth electrode have a same polarity but different voltages; and wherein the at least two fifth electrodes have a same polarity but different voltages.

9. The display panel recited in claim 4, wherein each black matrix further comprises a light shielding piece at a position adjacent to the respective electrically controlled capsule;
   wherein each electrically controlled capsule comprises a display portion and a non-display portion disposed around the display portion, wherein a projection of the non-display portion on the substrate overlaps a projection of the light shielding piece on the substrate;
   wherein when each electrically controlled capsule is in the first state, the respective black particles of the electrically controlled capsule are located in the non-display portion, and wherein when each electrically controlled capsule is in the second state, the respective black particles of the electrically controlled capsule are located in the display portion.

10. The display panel recited in claim 9, wherein a side of each electrically controlled capsule facing away from the substrate is lower than a side of the respective black matrix facing away from the substrate.

11. The display panel recited in claim 4, wherein the plurality of colored particles comprise a red particle, a green particle, and a blue particle; and wherein colored particles of only one color are disposed in each same electrically controlled capsule.

12. The display panel recited in claim 1, wherein each light-emitting element is a red light-emitting element, a green light-emitting element, a blue light-emitting element, or a white light-emitting element.

13. The display panel recited in claim 1, wherein there is further disposed a color filter layer on the plurality of electrically controlled capsules, wherein the color filter layer comprises a red filter, a green filter, and a blue filter; wherein the red filter is disposed corresponding to each red light-emitting element, the green filter is disposed corresponding to each green light-emitting element, and the blue filter is disposed corresponding to each blue light-emitting element;
   wherein at each same position, an projection area of each electrically controlled capsule onto the substrate is greater than a projection area of the respective color filter onto the substrate.

14. A display device, comprising a driver circuit and a display panel, wherein the driver circuit is used to drive the display panel to display;
   wherein the display panel comprises a plurality of opening areas and a plurality of non-opening areas, the display panel comprising:
   a substrate;
   a plurality of light-emitting elements, which are respectively arranged corresponding to the plurality of opening areas, wherein each light-emitting element comprises a bottom electrode, a light-emitting layer, and a top electrode that are stacked in sequence in a direction of farther getting away from the substrate;
   a pixel defining layer, arranged corresponding to each non-opening area;
   an encapsulation layer, used to cover the light-emitting elements and the pixel defining layers;
   an electrically controlled capsule layer, arranged on a side of the encapsulation layer facing away from the substrate and comprising a plurality of electrically controlled capsules, wherein each of the plurality of electrically controlled capsules is arranged corresponding to the respective opening area;
   wherein there is disposed a plurality of black particles in each electrically controlled capsule, and wherein the plurality of black particles are positively or negatively charged;
   wherein when each light-emitting element emits light, the respective electrically controlled capsule at a corresponding position is in a first state; when each light-emitting element does not emit light, the respective electrically controlled capsule at a corresponding position is in a second state;
   wherein the first state of each electrically controlled capsule is a light-transmitting state, in which the respective plurality of black particles are located on both sides of a light exit surface of the electrically controlled capsule; and wherein the second state of each electrically controlled capsule is a non-light-transmitting state, in which the respective plurality of black particles are located on a light-incident surface or a light exit surface of the electrically controlled capsule.

15. The display device recited in claim 14, wherein each electrically controlled capsule comprises at least a first electrode and a second electrode;
   wherein each electrically controlled capsule comprises a light exit surface and four side surfaces connected to the light exit surface, wherein the first electrode is arranged on the light exit surface, and the second electrode is arranged on at least one of the four side surfaces;

wherein when each light-emitting element emits light, the second electrode of the respective electrically controlled capsule is operative to attract the respective black particles so that the respective black particles are located on at least one of the four side surfaces of the electrically controlled capsule, and so the electrically controlled capsule is in the first state;

wherein when the light-emitting element does not emit light, the first electrode of the respective electrically controlled capsule is operative to attract the respective black particles so that the respective black particles are located on the light exit surface of the electrically controlled capsule, and so the electrically controlled capsule is in the second state.

16. The display device recited in claim 14, wherein there is further disposed a plurality of colored particles in each electrically controlled capsule, and wherein the plurality of colored particles in each electrically controlled capsule have a same color;

wherein each electrically controlled capsule layer further comprises a black matrix, and wherein every two adjacent electrically controlled capsules are separated by the black matrix; wherein the electrically controlled capsule and the black matrix are disposed in the same layer.

17. The display device recited in claim 16, wherein a number of the plurality of black particles is less than a number of the plurality of colored particles in each same electrically controlled capsule.

18. The display device recited in claim 16, wherein in each same electrically controlled capsule, the plurality of colored particles have a different charge polarity than the charge polarity of the plurality of black particles.

* * * * *